United States Patent [19]
Howard

[11] Patent Number: 5,936,559
[45] Date of Patent: Aug. 10, 1999

[54] METHOD FOR OPTIMIZING DATA COMPRESSION AND THROUGHPUT

[75] Inventor: Paul Glor Howard, Morganville, N.J.

[73] Assignee: AT&T Corporation, Middletown, N.J.

[21] Appl. No.: 08/871,403

[22] Filed: Jun. 9, 1997

[51] Int. Cl.⁶ .................................................. H03M 7/00
[52] U.S. Cl. ............................................ 341/81; 341/107
[58] Field of Search ........................... 341/81, 82, 107

[56] References Cited

U.S. PATENT DOCUMENTS

| | | | |
|---|---|---|---|
| Re. 35,781 | 5/1998 | Ono et al. | 341/51 |
| 5,023,611 | 6/1991 | Chamzas et al. | 341/51 |
| 5,404,140 | 4/1995 | Ono et al. | 341/107 |
| 5,587,710 | 12/1996 | Choo et al. | 341/107 |
| 5,737,345 | 4/1998 | Pelz et al. | 371/43.1 |
| 5,751,859 | 5/1998 | Howard | 382/238 |

*Primary Examiner*—Marc S. Hoff

[57] ABSTRACT

A method provides for the interleaving of arithmetic codes with either other codes, non-coded data or other arithmetically coded data. A method provides for reserving portions of a data stream for the first arithmetically coded data and interspersing the second coded data amongst the portions of the data stream reserved for the first arithmetic coder.

7 Claims, 7 Drawing Sheets

METHOD FOR OPTIMIZING DATA COMPRESSION AND THROUGHPUT

BACKGROUND OF THE INVENTION

The present invention is directed to a method for optimizing data compression while also improving throughput. More particularly, the present invention is directed to a method for interleaving arithmetic codes with other codes or unencoded data to provide an optimal combination of compression and throughput.

As people seek to communicate more and more frequently in the digital domain, that is transferring digital data between a source and a receiver, a limiting factor is the availability of channel resources. Channels typically are provided with a predetermined bandwidth based on the physical characteristics of the channel itself. To therefore increase the overall information throughput along the channel, it is beneficial to provide capabilities by which information can be transmitted through the channel utilizing the least amount of bandwidth possible.

Figure 1:
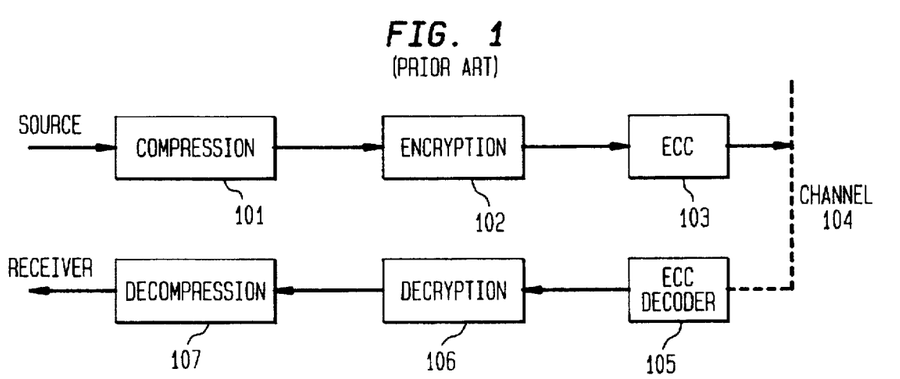
FIG. 1 illustrates a block diagram of a system for transmitting data between a source and a receiver.

FIG. 1 illustrates an example of a prior art configuration for transmitting data from a source to a receiver which keeps this goal in mind. In particular, source information, which ultimately could be in analog form and has been digitized by some analog to digital converter (not shown) is provided to a compression device 101. The compression device operates on the digital bit stream to reduce the number of bits needed to represent the information received from the source. Such information can take the form of a bit stream that is representative of some event, that is, for example, letters in text or pixels in an image. The compressed data is then provided to an encryption device 102 which can "scramble" the data to make it unusable by anyone who is not aware of both the encryption technique and the encryption key. This safeguards the data from being taken off of the channel by some third party and used without permission of the source. The encrypted data is provided to an error correction code (ECC) generator. This ECC generator provides additional information based on the encrypted data so as to permit the receiver to reconstruct data even where some limited number of errors occur in the course of the transmission of the data from the source to the receiver. The data is then provided to the channel 104. At a receiving end the data is then passed to a device referred to as "ECC decoder" 105 which uses the transmitted error correction code information to present a corrected data bit stream to the decryption device 106. The decryption device then deciphers the received data based on some encryption key to essentially provide to the decompression device 107 the same data bit stream which was provided from the compression device 101 to the encryption device 102. The decompression device thus takes what amounts to be the compressed data bit stream and expands it for use by the receiver (not shown).

Figure 2A:
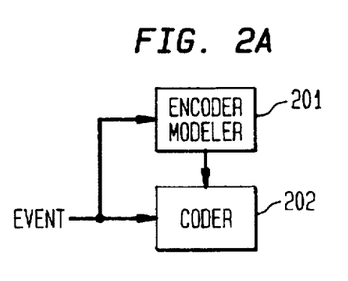
FIGS. 2A and 2B illustrate examples of elements contained within FIG. 1.
Figure 2B:
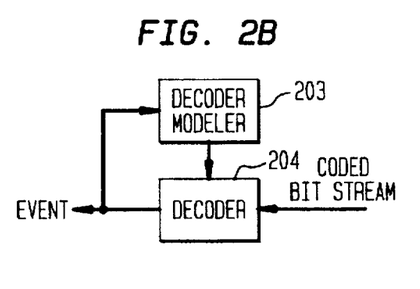

FIGS. 2A and 2B are block diagram representations of portions of the compression device and the decompression device of FIG. 1, respectively. In FIG. 2A the compression device may include an encoder modeler 201 and a coder 202. In this context the modeler and the coder will both receive the digital representation of events. The modeler will provide probabilities with respect to the events, for example, the probability that the letter "u" will follow the letter "q", to the coder. The coder takes this probability and based on the nature of the coder tries to produce a bit stream with the fewest bits possible.

FIG. 2B relates to what transpires at the receiver in the decompression module. In this instance, the coded bit stream is provided to the decoder 204. Again, the modeler 203 provides probability information to the decoder so that the decoder can take the coded bit stream and provide a stream of decoded events to the receiver as well as feeding the events back to the modeler. Such modelers are well known in the art.

Sometimes it may be desirable to use different codes in the same application and to have the output from the different coders appear in the same coded bit stream. One way to insure decodability is to have the encoder arrange the bits and the coded bit stream so that the decoder, by reading bits sequentially, will automatically extract those bits it needs, exactly when it needs them. This mechanism is called decoder-synchronized encoding. This technique has been described in literature, for example, "Bi-Level Image Coding with Melcode-Comparison of Block-Type Code and Arithmetic-Type Code", Ono et al., proceedings IEEE Global Telecommunications Conference, November 1989.

The prior art specifically describes interleaving codes referred to as run-length codes. These codes are based on the notion of producing a bit stream that represents how many occurrences in a row there are of more probable events. One example of such a run length code is referred to as a Golomb code described in "Run-Length Encodings", Golomb, IEEE Trans. Inform Theory IT-12, (July 1966), 399–401.

Run-length codes are one example of codes that might be used in an entropy encoder. Run-length codes provide more coding speed with a small amount of memory required. There are other types of entropy encoders known in the art.

For example, it is known to code data using Huffman codes. See "A Method for the Construction of Minimum Redundancy Codes", Huffman, Proceedings of the Institute of Radio Engineers, V.40, D. 1952, pp 1098–1101. These codes have the advantage that they are fast and are prefix codes. The disadvantage with Huffman codes is that they are sub-optimal, especially for events with high probabilities and do not handle binary alphabets. In addition, adaptive coding using Huffman codes tends to be slow.

Another known coding technique is arithmetic coding. Arithmetic coding is generally described in "Arithmetic Coding for Data Compression" by Howard et al., Proceedings of the IEEE, Vol. 82, No. 6, June 1994, pages 857–865. The disclosure of this paper is hereby incorporated by reference. Another reference describing arithmetic coding is "Arithmetic Coding for Data Compression" by Witten et al., Communications of the ACM, June 1987, Vol. 30, No. 6, pages 521–540. This second paper describes one of the available arithmetic codes commonly referred to as Witten-Neal-Cleary coding. For purposes of this discussion, it is helpful to review an example of an arithmetic code and the incremental coding with carry control will be used for this purpose. In theory, arithmetic codes assign one "codeword" to each possible data set. The codewords consist of half-open sub-intervals of the half-open unit interval [0,1) and are expressed by specifying enough bits to distinguish the sub-interval corresponding to the actual data set from all other possible sub-intervals. Shorter codes correspond to larger sub-intervals and thus more probable input data sets. In practice, the sub-interval is refined incrementally using the probabilities of the individual events with bits being output as soon as they are known.

Figure 3A:
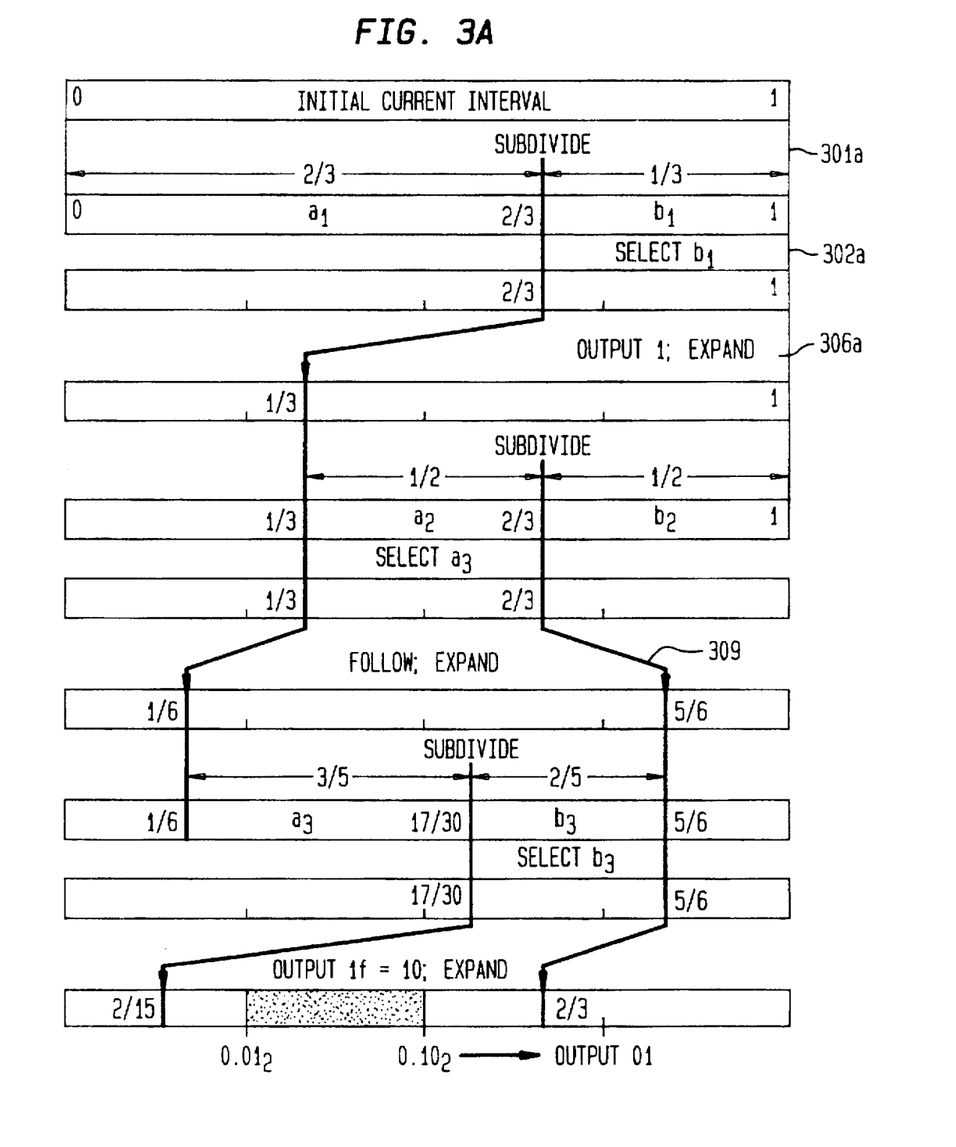
FIGS. 3A and 3B illustrate the flow of an arithmetic coding process that can be utilized in conjunction with the present invention.
Figure 3B:
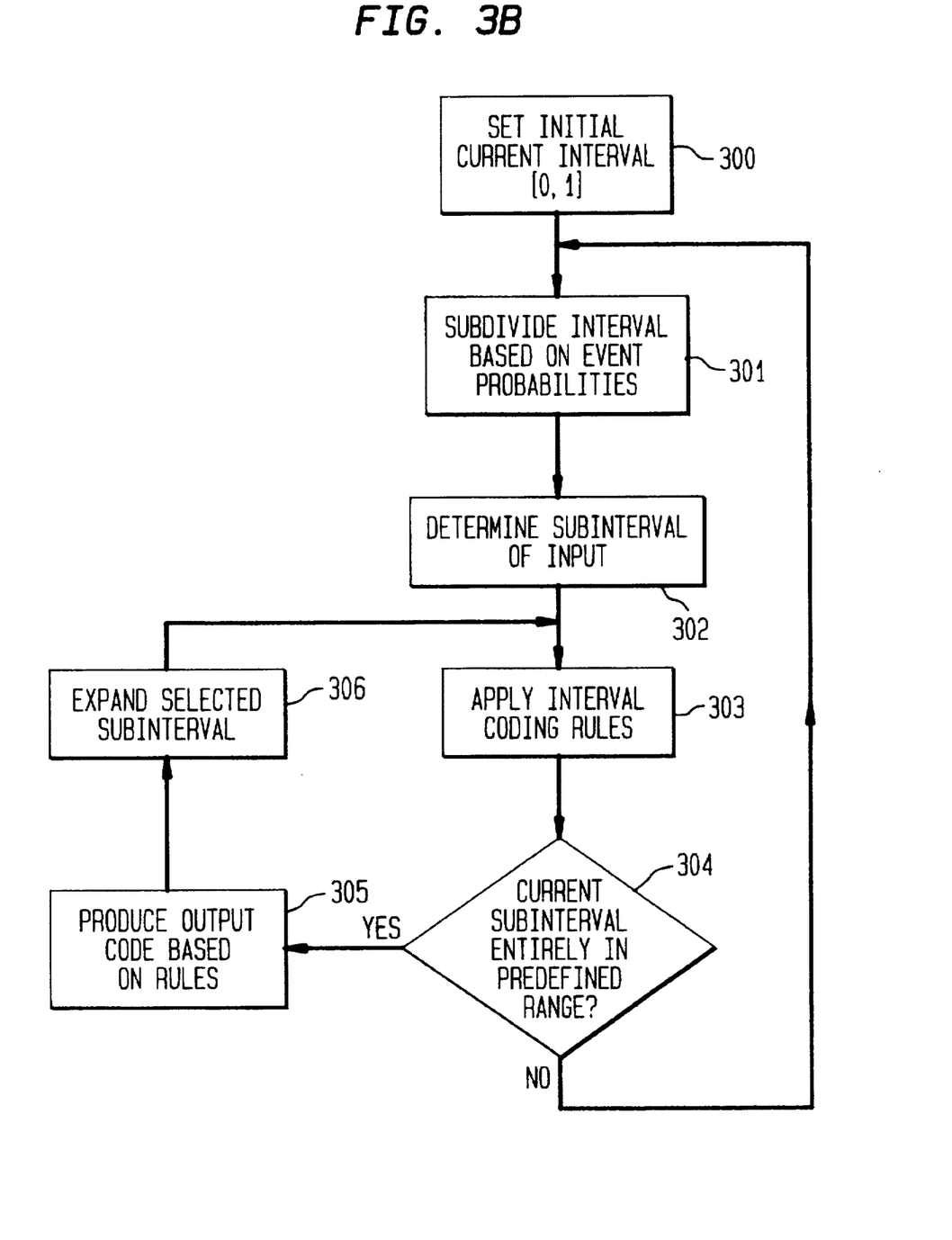

A basic description of how arithmetic coding works is provided with reference to FIGS. 3A and 3B which are related to an implementation of the incremental or Witten-Neal-Cleary coding. First, an initial current interval is defined [0, 1), step 300. Then in step 301 this initial interval is subdivided based on the probabilities associated with the first event. In the present example, assume that the first event is either a1 (with probability P {a1}=⅔) or b1 (with probability P {b1}=⅓); the second event is a2 (with probability P {a2}=½) or b2 (with probability P {b2}=½); and the third event is a3 (with probability P {a3}=⅗) or b3 (with probability P {b3}=⅖) . The actual file to be encoded in this example is the sequence b1a2b3. Thus, in the step of subdividing with respect to the first event, the interval is subdivided into subintervals corresponding to the probability of a1, that is, from 0 to ⅔ and the probability of b1, that is, from ⅔ to 1. In step 302, the coder then checks the input and determines it to be b1. This is identified as being in the b1 region so the subinterval [⅔, 1) is selected. According to the coding technique a plurality of interval coding rules are referred to in step 303 to determine what output, if any should be provided based on the location of the input within the particular subintervals. In this particular coding mechanism the rules are as follows:

1. if the designated or selected sub-interval lies entirely within [¼, ¾) the coder keeps track of this fact for future output by incrementing a follow count and then doubles the size of the sub-interval by linearly expanding [¼, ¾), to (0, 1);
2. if the selected sub-interval lies entirely within [0, ½), the coder outputs 0 and any following 1's left over from the previous events, then the sub-interval is doubled in size by linearly expanding [0, ½) to [0, 1);
3. if the new sub-interval lies entirely within [½ , 1), the coder outputs 1 and any following 0's left over from previous events, then the coder doubles the size of the sub-interval by linearly expanding [½, 1) to [0, 1); and
4. if the new sub-interval is not entirely within one of the intervals [0, ½ ], [¼,¾], or [½,1] then the coder exits the loop.

Now turning to our more specific example, as shown in FIG. 3A, once it is determined that the first event is b1, the interval coding rules are applied in step 303. If this new sub-interval does not fall entirely within one of the three ranges defined above, namely [0, ½ ), [¼, ¾), or [½, 1) then the system would exit the loop. This step is represented in FIG. 3B where it is determined whether the new sub-interval is entirely within a predefined range in step 304. If it is not within one of these predefined ranges then the process resumes with step 301 for the next event. In the present example, however the interval for b1, ⅔ to 1, is entirely within the interval [½, 1) so that 1 is immediately output and the sub-interval is doubled in size by linearly expanding so that the new sub-interval runs from ⅓ to 1. This constitutes the expansion of the sub-interval required by step 306. Then steps 303 through 306 are repeated until the test in step 304 returns "NO", in which case the process returns to step 301. Namely, the expanded sub-interval is subdivided using the probabilities of the second event. Since a2 and b2 each have an equal probability of occurring, that is ½, the interval is subdivided into two sub-intervals ⅓ to ⅔, and ⅔ to 1. In the example sequence the second event is a2 and so the sub-interval ⅓ to ⅔ is selected as shown in FIG. 3A. Since this sub-interval straddles ½, that is, the interval lies entirely within [¼,¾) the coder keeps track of this fact for future output by incrementing a follow count and expands the sub-interval, doubling it, see 309 in FIG. 3A. In this circumstance, the interval is expanded to [1/6, 5/6]. Once the sub-interval has been expanded to [1/6, 5/6] the new expanded sub-interval is subdivided in accordance with the probabilities associated with a3 and b3, namely a first subinterval of [1/6, 17/30] and a second subdivided interval [17/30, 5/6]. The input event, namely b3, is received and the appropriate subinterval is selected. Since this interval is entirely within [½, 1) the coder outputs a 1 and any following 0s left over from the previous events. Since there was one follow then the output is 10. The last interval is then expanded to [2/15, 2/3) Since all binary numbers that start with 0.01 are within this range, outputting 01 suffices to uniquely the range. As a consequence the encoded output for the event sequence b1 is 11001.

Arithmetic coding gives theoretical optimal compression and does not depend on a particular type of probability assignment. However, creating coding intervals requires multiplication and division which can be expensive and slow, especially by comparison to Huffman codes. Circumstances may arise where it would be beneficial to use arithmetic coding on one part of source data and some other code, for example, a Huffman code or identity code on another part. This is especially true where the source data consists of a stream of highly skewed and not-so-skewed data. Since the arithmetic code is slower it is preferable to avoid using the arithmetic coder with respect to not-so-skewed data reserving it only for highly skewed data. In one example of a potential data source, data to be coded using a system for compressing bi-level image data using pattern matching consists of approximately ½ highly skewed probability data and approximately ½ non-highly skewed data. Thus, it would be desirable if one could encode only part of the source data with the arithmetic encoder. In fact, it would be desirable to interleave arithmetic coding with either some other coding such as prefix coding or no coding at all thereby optimizing both the compression, using arithmetic coding on highly skewed data, and throughput, which is negatively influenced if arithmetic coding is otherwise used on non-highly skewed data.

SUMMARY OF THE INVENTION

The present invention provides a method which permits the interleaving of arithmetic codes with data provided by other coding techniques. In particular, in accordance with an embodiment of the present invention, a method interleaves arithmetically coded data and data not arithmetically coded.

In accordance with a method a codeword size of a selected arithmetic code is first identified. An initial portion of the data stream is then reserved for the arithmetically coded data where the size of the initial portion corresponds to the code word size. Selected data in the stream of data are subjected to arithmetic coding and the resulting codes are inserted at first into an initial portion of the coded data reserved for arithmetic codes. With each insertion of an arithmetic code into the data stream a further portion of the data stream is reserved for following arithmetic codes. On an as needed basis data that is not arithmetically coded is inserted between two portions reserved for receiving arithmetically coded data.

The present invention is applicable where it is desirable to interleave coded data produced by two different coding devices such as an arithmetic coder and a prefix coder. The present invention can also be employed to interleave different arithmetic codes. In the latter circumstance it is necessary to reserve space at the beginning of the data stream for each of the different arithmetic codes and the space for a given arithmetic code would correspond to the codeword size associated with that code.

DETAILED DESCRIPTION

The present invention provides for interleaving of arithmetic codes with non-coded data, data produced by a non-arithmetic coder, or even data from an alternative arithmetic coder(s). The present invention is made possible by recognizing and utilizing a number of characteristics of arithmetic coders and decoder-synchronized encoders.

First, with respect to these mechanisms practical implementations of arithmetic coding are driven by renormalizations. That is, the encoder outputs a bit (or schedules it for output) when the "current coding interval" becomes short enough that its length can be doubled or in other words, when the interval can be renormalized. Similarly, the decoder needs access to another bit when the current interval can be renormalized. What makes decoder-synchronized encoding feasible is that the encoder's and decoder's coding intervals are the same at all points in the coding process, so their renormalizations and bit I/O operations (input/output) take place at the same times relative to the sequence of unencoded data. The apparent difficulty is that a bit being output by the encoder and the bit being input by the decoder at the corresponding point in the coding process are not the same bit: the decoder inputs a bit from earlier in the code stream. However, the amount of decoder lead (or encoder lag) remains constant, and is just the number of code bits used to represent points in the coding interval. Thus, to obtain decoder-synchronized encoding, the encoder must do two things for each output bit: it must reserve a place for a bit in the output stream, and it must insert the actual output bit in the earliest available place previously reserved. For prefix coded bits, there is no encoder lag so reserving and insertion take place at the same location in the output stream. The following is a detailed description of implementing an interleaver for decoder-synchronized encoding of arithmetic and prefix codes. It should be recognized that instead of prefix codes, other codes could be used. In the present example, the arithmetic code referred to as the Witten-Neal-Cleary code but other implementations are also possible.

Since ultimately the encoder must output bits the encoder maintains a first-in-first-out (FIFO) queue containing information describing the status of each bit position to be output. One way to accomplish this is for the queue to contain "buffer bits", each containing an in-use flag, a count of reserved but uncommitted bits, and an array of eight buffer bits. Each buffer bit contains its value and, if the bit was reserved for arithmetic coding a pointer to the next buffer bit reserved for an arithmetically coded bit. Three global pointers to buffer bits are maintained: one to the last reserved bit, one to the first uncommitted bit reserved for arithmetic coding, and one to the last bit reserved for arithmetic coding. Thus, within the queue there is a linked sublist of uncommitted bits reserved for arithmetic coding. The coder further maintains a follow count and a pointer to the head of the queue (leading in-use buffer byte).

The queue may be implemented as a circular linked list. A buffer byte is added to the queue between the current tail and head when necessary to accommodate extra buffer bits. It is possible for an arbitrary number of buffer bits to be reserved for arithmetic coding but not committed, either when a large number of follow bits occur or when a large number of prefix-coded bits are acquired. The latter condition is more likely. However, it is more problematical since a single buffer byte in the implementation requires over 100 bytes of real memory. This could be reduced to just two bytes plus a small amount of overhead in an alternate implementation that uses a masking technique to reduce the use of pointers by some data structure changes such as by reducing the use of pointers.

Before coding begins the queue must be initialized. This is done by allocating a linked list of enough buffer bits to hold C bits where C is the number of code bits, that is, the number of bits used to specify each end point of the coding interval or to define the codeword size for the particular arithmetic coder. These bits are all uncommitted bits reserved for arithmetic coding. The first-uncommitted-arithmetic-bit pointer points to the first such bit, and the last-reserved-arithmetic-bit and last-reserved-bit-pointer point to the last such bit.

When the second coder, here a prefix coder, submits a bit for output a new buffer bit is reserved at the tail of the queue and the bit's value is put into the new buffer bit.

When the arithmetic coder submits a follow bit for output, the follow count F is incremented, and a new buffer bit is reserved at the tail of the queue. The pointer from the last reserved arithmetic coding bit is set to point to the new bit, and then both last-reserved-bit pointers are also pointed at the new bit.

When the arithmetic coder submits a 0 or 1 bit for output, a new (arithmetic) buffer bit is reserved at the tail of the queue. The submitted bit is put into the first reserved uncommitted arithmetic-coding bit; then the complement of the submitted bit is put into each of the next F reserved arithmetic coding bits, following the arithmetic coding link sublist. The pointers are updated, and the follow count F is reset to 0. Then the queue is checked and any in use bits with no uncommitted bits are output and marked not in use.

At the end of coding, the queue must be flushed.

An example showing how an arithmetic code and a prefix code can be interleaved in accordance with the present invention is shown in FIGS. 4A to 4H.

Figure 4A:
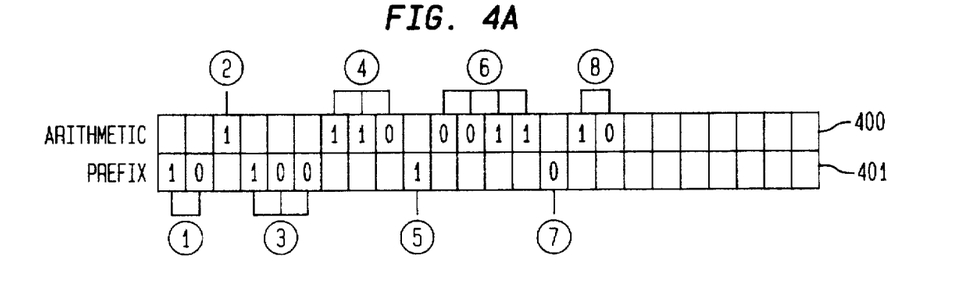
FIGS. 4A to 4H illustrate how a data stream including arithmetically coded data can be produced in accordance with the present invention.

FIG. 4A illustrates an arithmetic code in stream 400 and a prefix code in stream 401. As can be seen from the drawing, arithmetic coding and prefix coding can be done in parallel such that a prefix code events ①, ③, ⑤ and ⑦ are interspersed among arithmetic coding outputs ②, ④, ⑥ and ⑧.

Figure 4B:
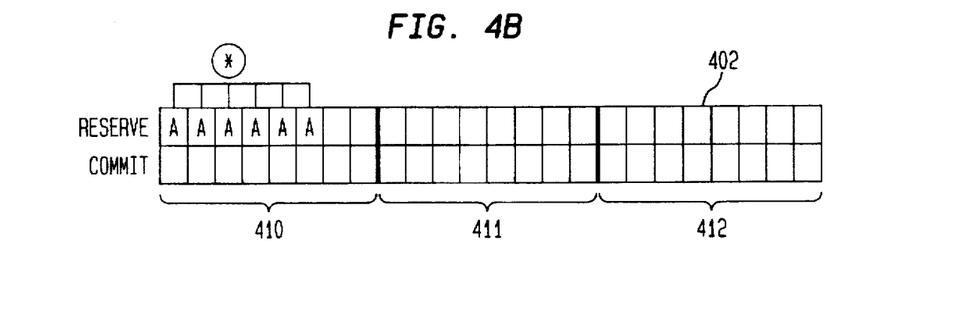
Figure 4C:
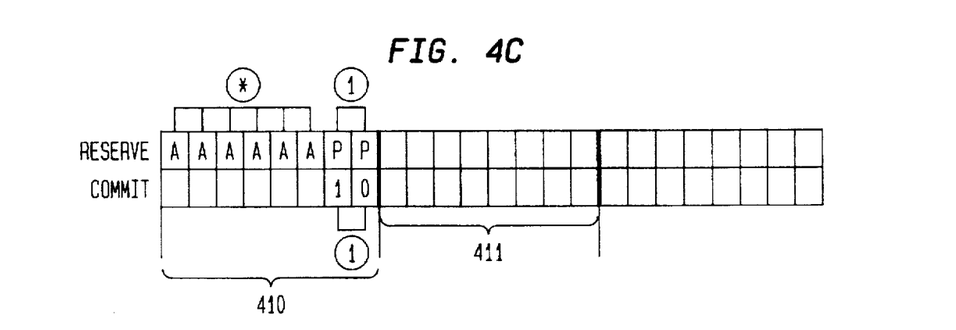

At the beginning of the interleaving process as shown in FIG. 4B a predetermined number of bits of the initial portion of the data stream are reserved in an encoder queue 402. Three bytes of the queue are shown, 410, 411 and 412. The reserved bits are represented by the letters "A". These reserved bits are provided in a number corresponding to a codeword size of the arithmetic coder. In this example, the codeword size is assumed to be six bits. Therefore, at initialization the interleaver reserves the first six bits of the queue for arithmetic codes. FIG. 4C shows how the prefix codes of event ① are inserted into the data stream. In this instance the prefix codes are assigned to the first available, unreserved, uncommitted bits, namely the last two bits of the first byte, 410, of the data stream. Thus, the prefix code 10 is placed into the first two available bits following the reserved six bits.

Figure 4D:
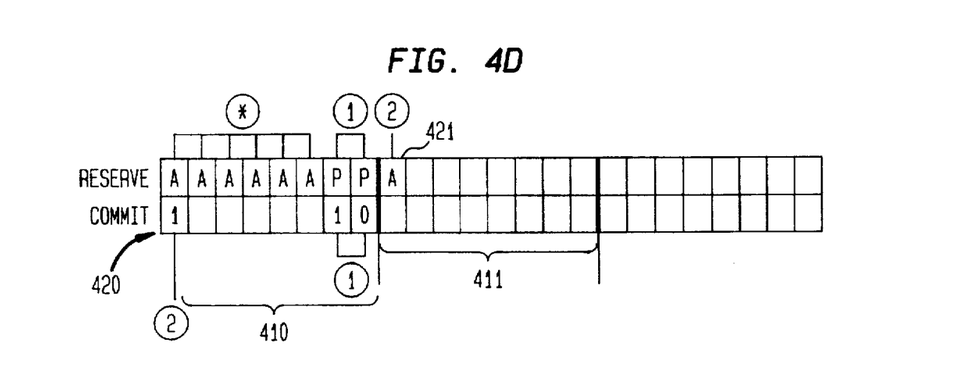

Referring to FIG. 4A the next event is the production of a single bit of arithmetic code, coding event ②. This single bit of code is inserted in the first reserved uncommitted bit, 420, as shown in FIG. 4D. Furthermore, with the insertion of a single bit 30 into the first reserved bit, an additional bit is reserved, that is the first bit after the last entry, namely the first bit of the second byte of data, 421.

Figure 4E:
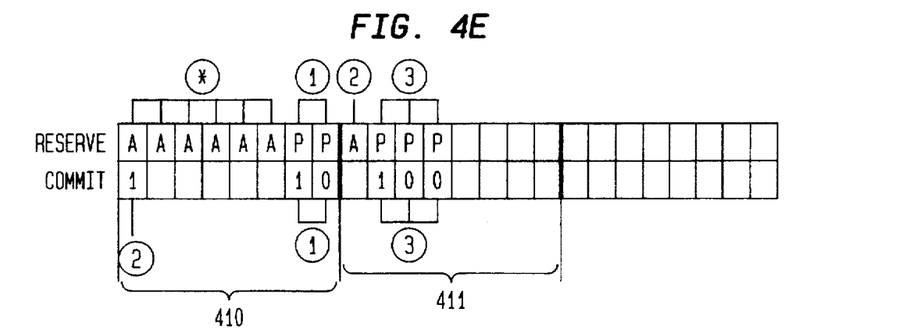

FIG. 4E shows that with coding event ③ being three bits of prefix code, this three bit code of "100" is inserted in the first available unreserved, uncommitted bits, namely bits 2 to 4 of the second byte. To this point no output bits have been provided since five bits in the initial byte still remain reserved for arithmetic codes but are unfilled.

Figure 4F:
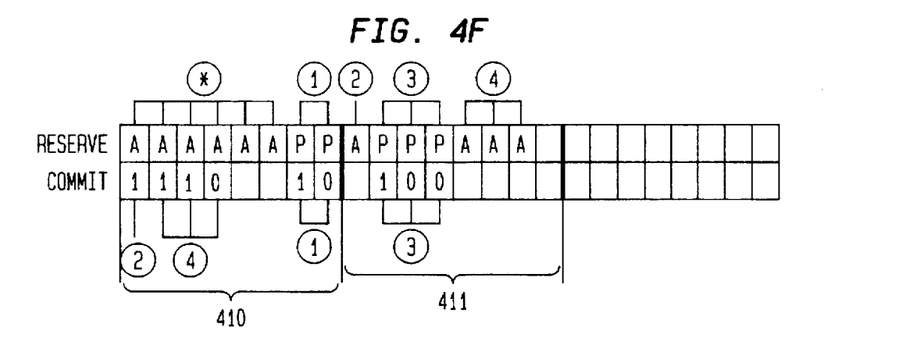

FIG. 4F shows how the arithmetic code sequence "110" corresponding to coding event ④ is inserted into the data stream in the queue. These three bits are inserted into the next available reserved, uncommitted bits, namely bits 2 to 4 of the first byte, 410, of data. With the insertion of these three bits into these reserved bits, three more bits in the queue are reserved immediately following the last entry of prefix bits. This is shown by the additional three bits corresponding to AAA, 450, at the tail end of the queue in FIG. 4F.

Figure 4G:
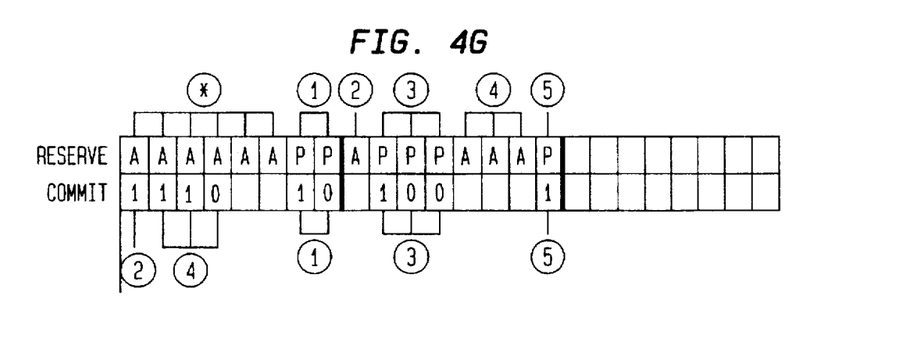

The data stream production continues as shown in FIG. 4G where the single prefix code of coding event ⑤ is inserted then in the next available unreserved uncommitted bit, namely the last bit of the second byte, 411, of the queue. Still the first byte, 410, has not been completed. It should be noted, however, that there still remain six uncommitted bits reserved for arithmetic coding. By always reserving an additional bit once a bit is added the interleaver maintains a number of reserved bits equal to the codeword size of the coder.

Figure 4H:
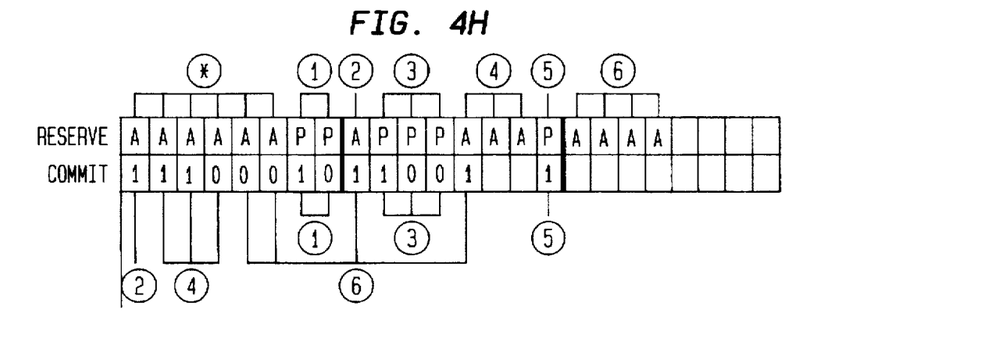

FIG. 4H shows what transpires when the four-bit arithmetic code of coding event 6 is provided to the interleaver. The first two bits, 00 are inserted into the last two reserved bits of the first byte, 410. The third bit, 1, is inserted into the next reserved uncommitted bit which is the first bit of the second byte, 411. Finally, the last bit, 1, is inserted into the next subsequent reserved uncommitted bit which is the fifth bit of the second byte, 411. As these four bits are inserted into their proper location in the bit stream, four additional bits are reserved as shown at the tail end of the queue in FIG. 4H. With this insertion of arithmetic codes the first byte of the data stream is complete and can be released. Since the data are produced by a decoder-synchronized encoder, as the data are received at the decoder it is understood by the decoder that the first six bits are reserved for arithmetic coding and that the next two bits are prefix codes. The decoder then pulls out the appropriate bits for the arithmetic decoder and the prefix decoder based on this synchronous relationship between encoder and decoder.

In accordance with the present invention the non-arithmetically coded data can automatically be inserted into a location within the data stream and need not await the production of any other information for determining its location. As a consequence, such non-arithmetically coded data as prefix coded data or non-coded data are interspersed amongst reserved but unfilled bits in the queue. This should increase the throughput without greatly reducing the compression since the prefix codes are more applicable to less highly skewed data than are arithmetic codes.

FIGS. 5A to 5E disclose an example of the present invention in which an arithmetic code employing "follows" is utilized. In this instance, the arithmetic code stream 500 includes a number of bit locations "f" which represent follows which indicate that the selected sub-interval in the coding operation straddles the (½) probability such that it cannot be determined whether to output a 0 or a 1 and this information must await further definition. These "follows" were described above in connection with the Witten-Neal-Cleary code.

Figure 5A:
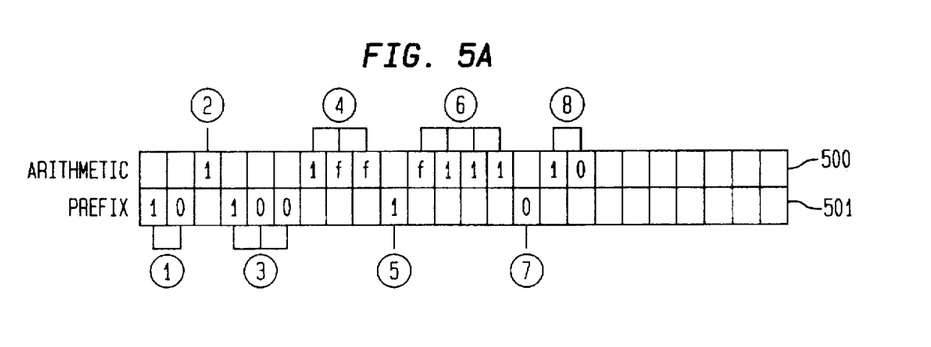
FIGS. 5A to 5E illustrate another example of how a data stream including arithmetic encoding interleaved with other data can be produced in accordance with the present invention.
Figure 5B:
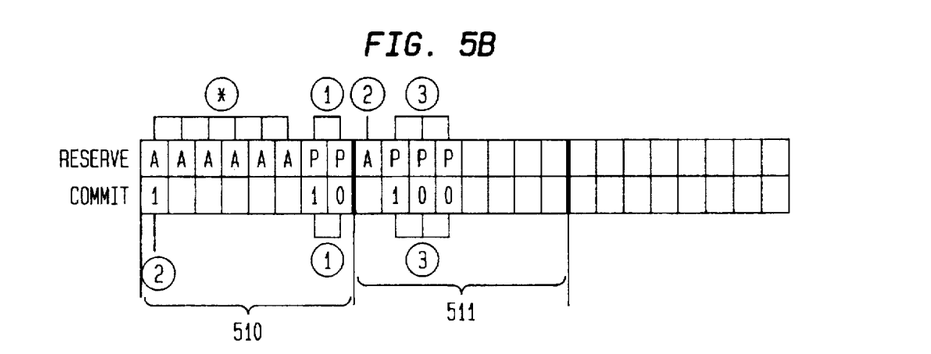
Figure 5C:
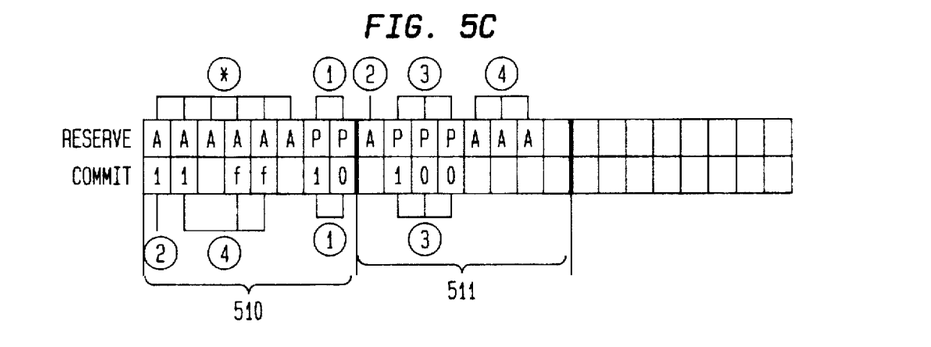

As in the example described with respect to FIG. 4, during initialization a number of bits at the beginning of the queue into which the data stream is inserted are reserved. The number of reserved bits corresponds to the codeword size of the encoder. Again, the number in the example is six bits. In FIG. 5B the prefix codes are first inserted as coding event 1 in bits 7 and 8 of the first byte, 510. Subsequently, an arithmetic code corresponding to coding event ② is inserted in the first bit of the first byte 510 and an additional bit is reserved which corresponds to the first bit of the second byte, 511. Then, as in the example of FIG. 4 the three bit prefix code of coding event ③, "100" is inserted in the next three unreserved, uncommitted, that is, available, bits, namely bits 2 to 4 of the second byte 511. FIG. 5C begins to show how the "follow" bits are treated in accordance with the present invention. In particular, the next three bit arithmetic code is constituted by "1ff". In connection with these three bits, four of the reserved uncommitted bits are allocated as shown in FIG. 5C. Specifically, the "1" bit is assigned to the second bit of the first byte, 510. Then, since the next bit in the arithmetic code is a follow bit, f, the next reserved bit is skipped over and remains reserved but uncommitted. The subsequent follow bits ff are inserted in bits 4 and 5. Despite the fact that four of the reserved bits in the first byte 510 have been affected, only three additional bits are reserved at the tail end of the queue as shown in FIG. 5C. This is because only three bits as yet have been inserted into the data stream.

Figure 5D:
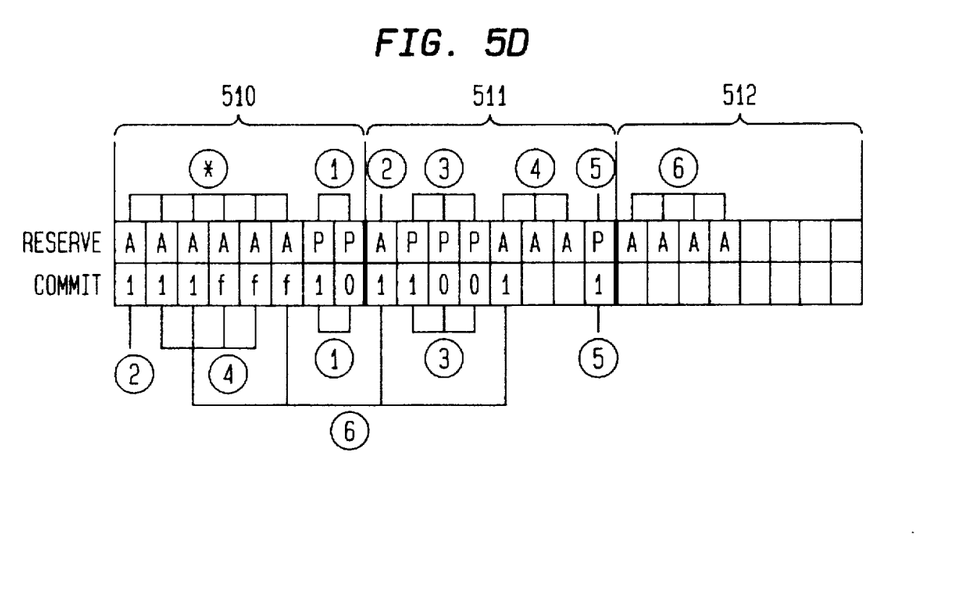
Figure 5E:
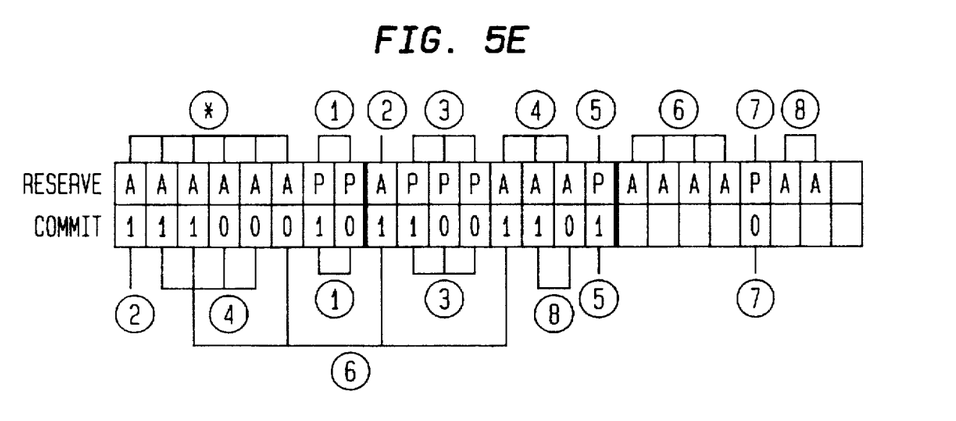

FIG. 5D shows that the prefix code of coding event 5 is then inserted in the next available space, that is bit 8 of the second byte, 511. Subsequently, in coding event ⑥ a four bit arithmetic code is produced, f111. The first f is then inserted into the sixth bit of the first byte. Then since the bit immediately following this string of "follows" is a "1", that "1" is inserted into the skipped over, third bit of the first byte 510. Furthermore, the last two bits of this four bit arithmetic code 11 are inserted into the next two reserved bits, namely the first bit of the second byte and the fifth bit of the second byte. Since four bits have been inserted into the data stream four additional bits are reserved at the tail end of the data stream beginning with the first available bit, namely bit 1 of the third byte 512. Since the bit that followed the sequence of follows was a "1", the interleaver changes the "f" bits to "0". If, alternatively, the bit immediately following the string of follows was a "0" then a "0" would have been inserted in the third bit of the first byte 510 and the subsequent "f" bits would have been changed to "1". Thus, the interleaver sufficiently deals with the follow situation by skipping a reserved bit and keeping it available for the definition of the bit that is subsequent to the string of follows. It then adjusts the follow bits which have been inserted into the data stream after that defining bit is determined.

The present invention's adaptation of the arithmetic code and the prefix or non-arithmetic code to the data stream allows the coder to take advantage of the optimal compression that is achievable when data is highly skewed, without unnecessarily affecting the throughput as non-highly skewed data is interspersed in the data in question. The present invention accomplishes this by appropriately reserving space in a coding queue based on an arithmetic coder codeword size and continually provides reserved bits corresponding to that codeword size as arithmetic code bits are inserted into the data stream. Furthermore, the present invention permits the immediate insertion of either prefix coded or unencoded data into the data stream between bits otherwise reserved for arithmetic coding.

It is conceivable that a user may also desire to intersperse or interleave different arithmetic codes, for instance, a binary arithmetic coder and an arithmetic coder for a multisymbol input alphabet. In such a circumstance it is possible to use the same basic principles as the present invention. In that circumstance, one arithmetic coder would have to be designated as the first coder and a second arithmetic coder would have to be designated as the second coder.

At the initialization two different sets of bit reservations would have to be performed. For instance, a number of bits corresponding to the codeword size of the first coder could be reserved at the head of the queue and thus the start of the stream. A second group of bits, immediately following the first group, of a number corresponding to the code word size of the second coder could be reserved. Then, as codes from the first coder are inserted into the reserved spaces additional spaces would be reserved as in the previously described examples. The only difference here is that when the second coder inserts its data it would not do so in the first immediately unreserved/uncommitted bits in the data stream. Instead, it would be inserted in bits reserved for that second arithmetic coder and further bits would subsequently be reserved in the same manner that bits are reserved in connection with the first arithmetic coder.

The above examples have related to carrying out operations on a bit basis. The invention is equally applicable where things are done on a byte basis. For instance with respect to the example of FIGS. 4A to 4H, assume that the only different assumption is that the mechanism works on a byte basis. Under this circumstance at initiation, the processor reserves 1 byte for arthmetic codes at the head of the queue, the codeword size being rounded up to the next nearest byte. (Of course, if the codeword size is greater than 8 bits more than 1 byte would be reserved, rounding up to the next nearest number of bytes.) Then as the first prefix code is provided by coding event 1 a byte is set aside for the prefix code, the second byte, since the entirety of the first byte has been reserved for the arithmetic codes. As the arithmetic code is produced and inserted into the reserved, yet uncommitted bits, the system will only reserve another byte for arithmetic coding when the number of reserved, uncommitted bits falls below the codeword size. Therefore, it in this example, when the third arithmetic code bit is inserted in the first reserved byte, another byte will be reserved for arithmetic coding. Using the arithmetic code and prefix code of FIG. 4A as a sample, the newly reserved byte would correspond to the third byte of the queue. Other than slightly increasing the latency, the byte-wise version of the present invention operates under the identical principles as the bit-wise version.

It should be understood by those skilled in the art that the above described operations are implementable in software that can be run on general purpose computer.

The present invention provides for an improvement to coding techniques by allowing the interleaving of codes that are appropriate for different skewings of probabilities and for different input alphabet sizes. The invention provides the further advantages that the encoder sections of existing compression systems require only small changes, and the decoder sections of such systems require no changes at all.

What is claimed is:

1. A method for producing a data stream that interleaves arithmetically coded data and data not arithmetically coded, the method comprising the steps of:

identifying a code word size associated with a selected arithmetic code;

reserving an initial portion of the data stream for arithmetically coded data, the size of said initial portion corresponding to said code word size;

coding selected data using the selected arithmetic code;

inserting an initial portion of the coded data into the reserved initial portion of the data stream;

reserving additional portions of said data stream every time coded data is inserted into a previously reserved portion of said data stream; and inserting on an as needed basis data not arithmetically coded between two portions reserved for receiving arithmetically coded data.

2. A method for producing a data stream in which data encoded by a first encoder are interleaved with data encoded by a second encoder, the method comprising the steps of:

reserving space in a queue for data encoded by said first encoder, a size of the reserved space corresponding to a code word size associated with said first encoder;

coding data with said first encoder;

inserting each bit of data coded by said first encoder into a reserved space in the queue;

for each bit of data inserted into the reserved space, reserving an additional bit of space in said queue;

coding other data using said second encoder; and inserting data coded by said second encoder into said queue, wherein said data coded by said second encoder is positioned between two spaces reserved for data coded by said first encoder.

3. The method of claim 2 wherein said first encoder performs an arithmetic encoding.

4. The method of claim 3 wherein said arithmetic encoding comprises incremental coding with carry control.

5. The method of claim 3 wherein said second encoder performs prefix encoding.

6. The method of claim 3 wherein said second encoder performs arithmetic coding.

7. A method for producing a data stream in which data encoded by an arithmetic encoder are interleaved with data encoded by a second encoder, the method comprising the steps of:

reserving space in a queue for data encoded by said arithmetic encoder, a size of the reserved space corresponding to a code word size associated with said arithmetic encoder;

coding data using said arithmetic encoder, said step of coding including the sub step of incremental coding using follow bits;

inserting each bit of coded data from said arithmetic encoder into a reserved space in the queue wherein a reserved space of one bit is left unfilled before the first of a string of follow bits;

for each bit of data inserted into the reserved space, reserving an additional bit of space in the queue;

coding other data using said second encoder;

inserting data coded by said second encoder into said queue, wherein said data coded by said second encoder is positioned between two spaces reserved for data coded by said arithmetic encoder; and wherein said arithmetic encoder inserts a bit coded immediately following a string of follow bits into the unfilled space before the first follow bit of said string of follow bits and reserves an additional bit of space in the queue.

* * * * *